(12) United States Patent
Chung et al.

(10) Patent No.: US 7,145,346 B2
(45) Date of Patent: Dec. 5, 2006

(54) ON-CHIP RESISTANCE MONITOR AND DIAGNOSES FOR ELECTRICAL FUSES

(75) Inventors: Shine Chien Chung, Taipei Hsien (TW); Yun-Sheng Chen, Baoshan Shiang (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/117,580

(22) Filed: Apr. 28, 2005

(65) Prior Publication Data

US 2005/0247997 A1 Nov. 10, 2005

Related U.S. Application Data

(60) Provisional application No. 60/569,215, filed on May 7, 2004.

(51) Int. Cl.
*G01R 31/02* (2006.01)

(52) U.S. Cl. .................................. 324/550; 324/525
(58) Field of Classification Search ............... 324/550, 324/525
See application file for complete search history.

(56) References Cited

U.S. PATENT DOCUMENTS

| 5,731,733 | A  | * | 3/1998 | Denham ..................... 327/525 |
| 6,541,983 | B1 | * | 4/2003 | Khoury ...................... 324/550 |
| 6,903,598 | B1 | * | 6/2005 | Denham et al. ............. 327/525 |

* cited by examiner

*Primary Examiner*—Walter Benson
(74) *Attorney, Agent, or Firm*—Preston Gates & Ellis LLP

(57) ABSTRACT

A fuse resistance monitoring system is disclosed to comprise at least one non-regenerative sense amplifier; at least one fuse module having at least one fuse cell coupled to a first terminal of the sense amplifier; and a reference resistor coupled to a second terminal of the sense amplifier, wherein a source voltage node between the fuse module and the sense amplifier is monitored to reflect a resistance of the fuse cell.

18 Claims, 8 Drawing Sheets

ON-CHIP RESISTANCE MONITOR AND DIAGNOSES FOR ELECTRICAL FUSES

CROSS REFERENCE

The present application claims the benefits of U.S. Provisional Patent Application Ser. No. 60/569,215, which was filed on May 7, 2004 and entitled "On-Chip Resistance Monitor and Diagnoses for Electrical Fuse."

BACKGROUND

The present invention relates generally to integrated circuit designs, and more particularly to methods for implementing on-chip resistance monitoring for electrical fuses.

Fuse elements are widely used in semiconductor memory devices. In a typical application, a plurality of fuse elements are employed in a semiconductor memory device, e.g., a dynamic random access memory (DRAM) device. In general, each of the fuse elements includes a fuse which is selectively opened or severed in order to thereby selectively disconnect the corresponding fuse element from the remainder of the circuit. The process of opening or severing a fuse is sometimes referred to as "blowing a fuse."

There are two basic techniques currently in use for blowing a fuse. Namely, a laser can be used to irradiate (burn) the fuse until it is opened, or an electrical current which dissipates sufficient heat to open the fuse (i.e., an electrical "overcurrent") can be used. The process of opening a fuse of a fuse element (which typically also includes at least a MOS transistor) is frequently referred to as "programming" the fuse element. Unlike using the laser, the technique of programming a fuse element by using an electrical overcurrent can be performed even after the device has been packaged. The technique of programming a fuse element by using an electrical overcurrent to blow the fuse thereof will be hereinafter referred to as "electrically programming" the fuse element, and the fuse element which is susceptible to such programming will hereinafter be referred to as an "electrically programmable fuse element" or simply e-fuse.

The e-fuse in the semiconductor devices may be a poly fuse, MOS capacitor anti-fuse, diffusion fuse, or contact anti-fuse, and can be programmed into high resistance state. For example, they can be used in an integrated circuit for chip ID, or serial number. Most fuses can only be programmed once to provide 0 or 1 states corresponding to high or low resistance states or vice versa.

However, the resistance value of electrical fuses must be read before and after programming, since the resistance value of an electrical fuse helps to determine whether or not the electrical fuse has been programmed. The ability to obtain an accurate resistance value for an electrical fuse can also lessen the chance of programming failure. Since electrical fuses require a high current to break during programming, by knowing the resistance of a specific fuse, the exact voltage needed to break the fuse can be calculated, thereby ensuring that the fuse will break during programming.

Conventional methods to monitor resistance of electrical fuses can only output logic states of "0" or "1" rather than giving an exact resistance value. While detecting the resistance states of the fuses, since a fuse is "hidden" in a fuse macro, and the resistance value is also hidden, only the logic states are brought out for examination. As such, the process for programming and debugging becomes much more difficult.

Therefore, desirable in the art of electrical fuse monitoring are additional methods and designs that enable an accurate monitoring of resistance values for electrical fuses, thereby increasing programming accuracy.

SUMMARY

In view of the foregoing, this invention provides methods and circuits for implementing on-chip resistance monitoring for electrical fuses.

In one embodiment, a fuse resistance monitoring system is disclosed to comprise at least one non-regenerative sense amplifier; at least one fuse module having at least one fuse cell coupled to a first terminal of the sense amplifier; and a reference resistor coupled to a second terminal of the sense amplifier, wherein a source voltage node between the fuse module and the sense amplifier is monitored to reflect a resistance of the fuse cell.

The construction and method of operation of the invention, however, together with additional objects and advantages thereof will be best understood from the following description of specific embodiments when read in connection with the accompanying drawings.

DESCRIPTION

As it is known in the art, multiple fuse elements form a fuse macro, which is typically used for designing a fuse cell. In order to monitor the fuse resistance, test structures are placed with the fuse macro so that the fuse cell can be programmed and analyzed by external testers. Unfortunately, the correlation between external test structures and the fuse elements in the fuse macro is difficult to identify, not to mention that the test structure tends to use a relatively large substrate area. The present disclosure provides novel on-chip fuse resistance monitoring and diagnosis circuits without excessive testing circuits.

Figure 1:
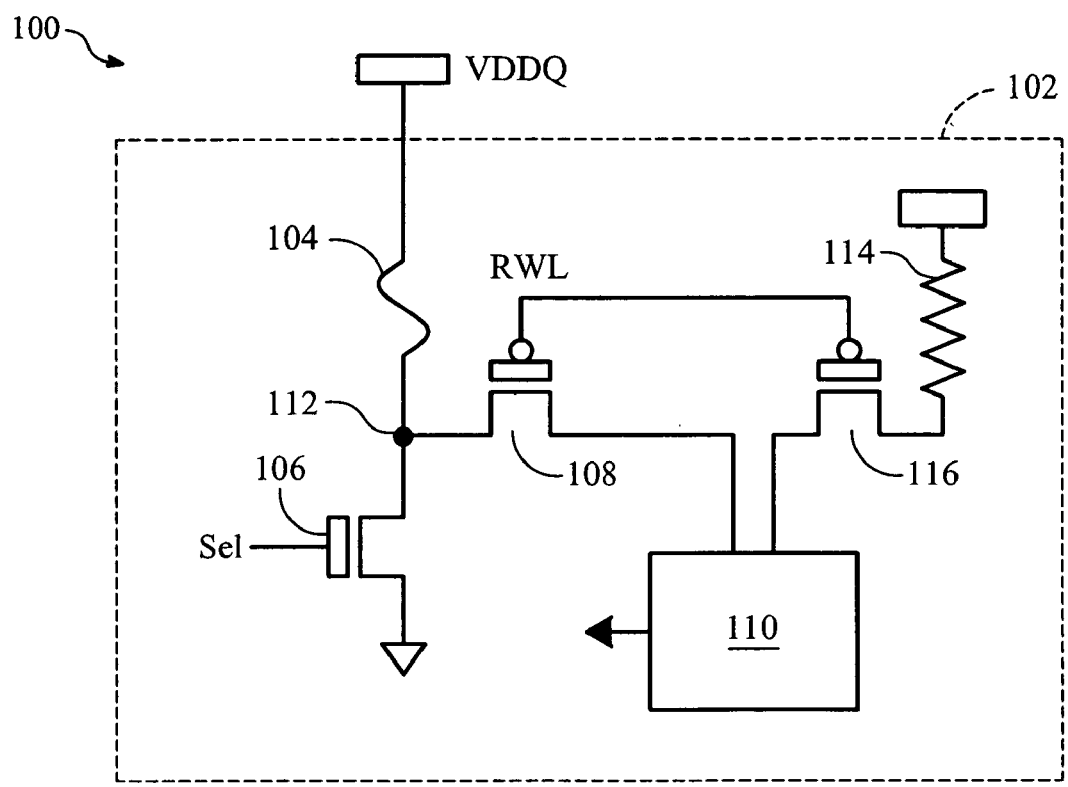
FIG. 1 illustrates a conventional circuit for monitoring resistance of an electrical fuse.

FIG. 1 illustrates a conventional circuit 100 for monitoring resistance of an electrical fuse. A fuse cell 102 is used to store data contained in an electrical fuse 104. The fuse cell 102 further includes a select device 106, an output select device 108, and a sense amplifier 110. The sense amplifier 110 is designed to compare the resistance of the electrical fuse 104 at a node 112 against the resistance of a reference resistor 114, and to output a logic state "0" or "1" response. This logic state output can determine if the resistance of the electrical fuse 104 is within the resistance range of the reference resistor. With this output information, the necessary level of programming voltage can be determined and applied at a source voltage VDDQ to ensure that the electrical fuse 104 is properly programmed.

If the electrical fuse 104 is to be programmed to store data, a read wordline RWL must have a high signal during programming to turn off the output select device 108 in order to keep current away from the sense amplifier 110. The select line will provide a high signal to turn on the select device 106, thereby allowing the source voltage VDDQ to break the electrical fuse 104.

To read the state of the electrical fuse 104, a low signal can enter through the read wordline RWL, thereby turning on both the output select device 108 and an enable device 116. This allows the sense amplifier 110 to compare resistance values of the electrical fuse 104 and the reference resistor 114. After comparing the two values, the sense amplifier 110 outputs a logic state response.

It is noteworthy that the select device 106, the output select device 108, and the enable device 116 can be PMOS, NMOS, or zero-$V_t$ MOS.

Figure 2:
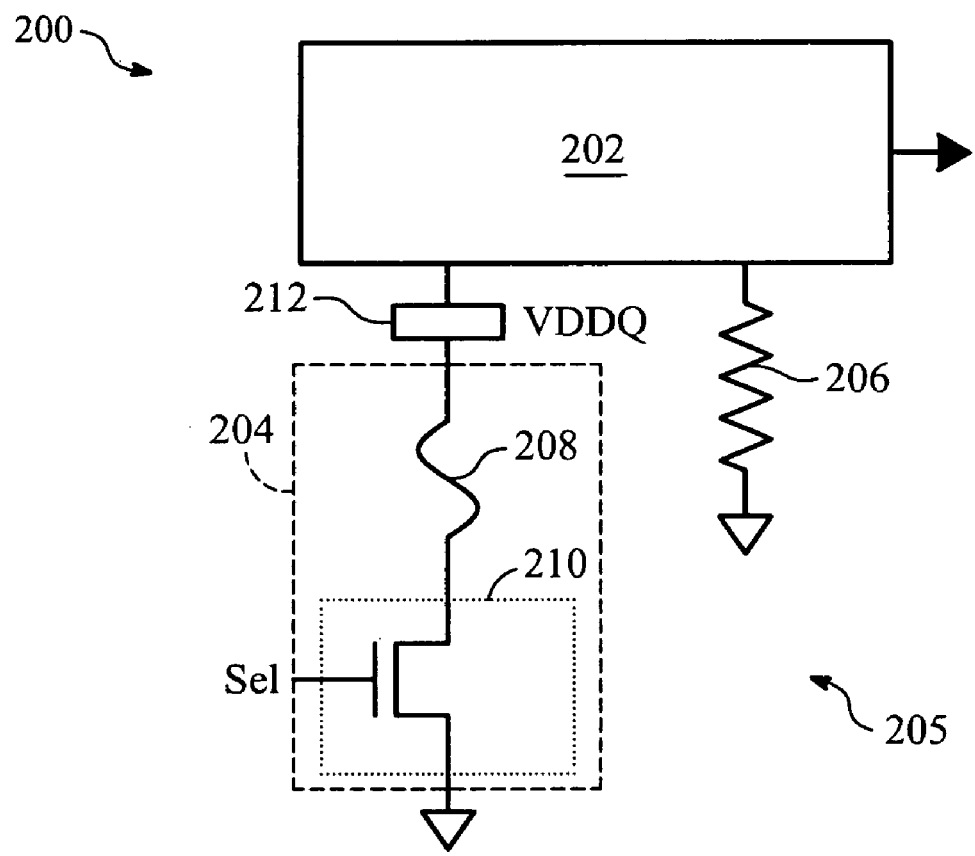
FIG. 2 illustrates a circuit for monitoring resistance of an electrical fuse in accordance with the first embodiment of the present invention.

FIG. 2 illustrates a circuit 200 for monitoring resistance of an electrical fuse in accordance with a first embodiment of the present invention. A sense amplifier 202 is designed to compare the resistance value of an electrical fuse against that of a reference resistor, and to output the difference. The sense amplifier 202 has two inputs that are coupled to a fuse module 205 containing a fuse cell 204 and a reference resistor 206. It is understood by those skilled in the art that the sense amplifier 202 may be a non-regenerative type sense amplifier, which has no feedback or latch-type circuitry involved in the sensing procedures.

In a simple configuration, the fuse cell 204 may comprise an electrical fuse 208 and a select device 210 and is also connected to the sense amplifier 202, through a source voltage node 212 (e.g., VDDQ).

When the electrical fuse 208 is to be programmed, the select device 210 is turned on by a high signal from a select line "Sel" and the source voltage 212 will raise to, for example, a high voltage of 2.5 to 3.3 volts. When the electrical fuse 208 needs to be read, the source voltage 212 is left floating externally and is clamped to a few hundred milli-volts internally by the sense amplifier 202 to provide less reading disturbance. The signal from the select line "Sel" will select the select device 210 to allow the sense amplifier 202 to compare the resistance of the electrical fuse 208 against that of the reference resistor 206. In essence, the voltage measured at the source voltage 212 during a read process is related to the fuse resistance after turning on the select device 210. Since the voltage is clamped by the sense amplifier to a small value such as a few hundred millivolts, there is very little disturbance for the read process.

Figure 4A:
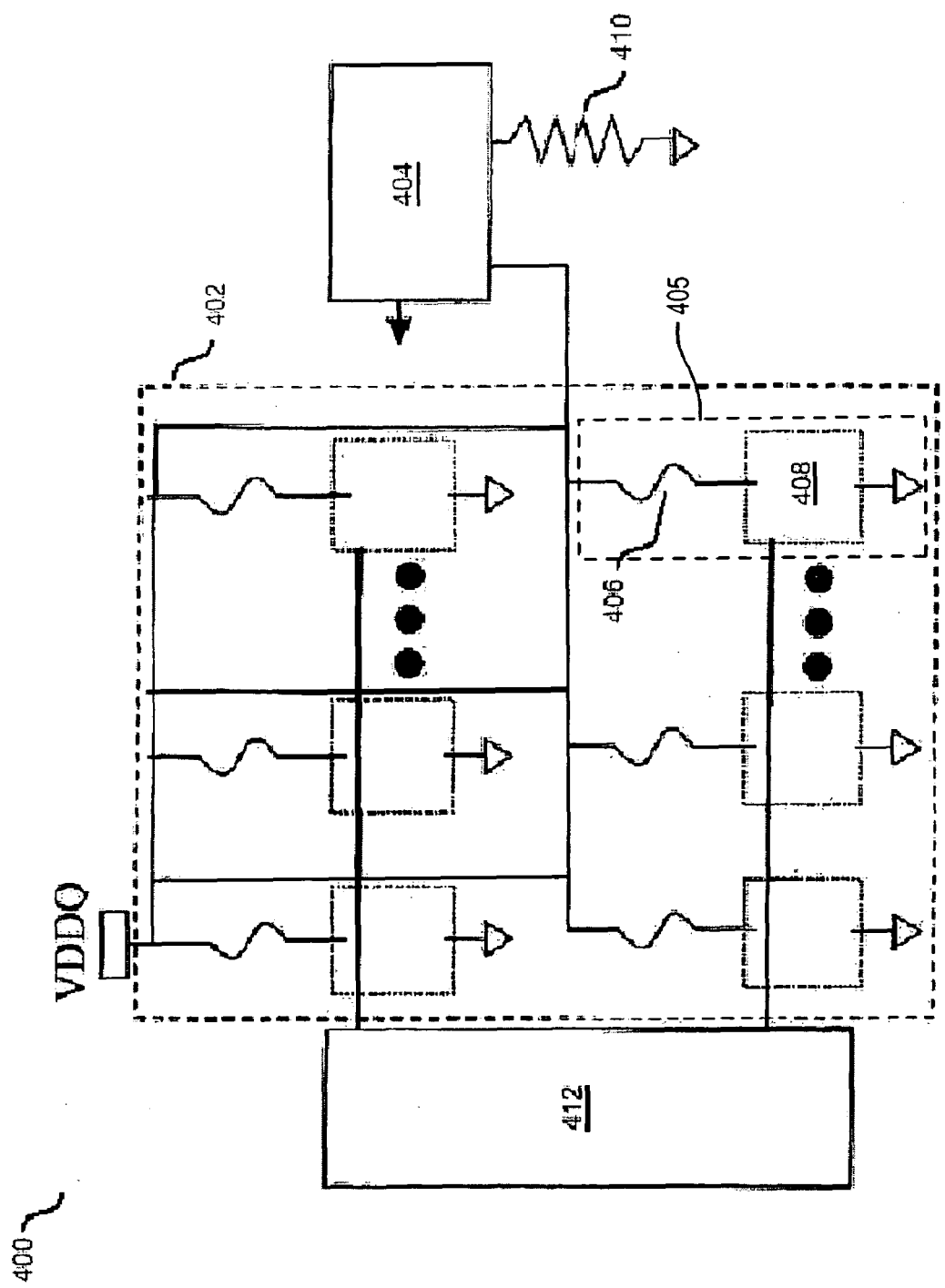
FIG. 4A illustrates a circuit for monitoring resistance of an electrical fuse in at least one fuse cell in accordance with the second embodiment of the present invention.

By placing the fuse cell 204 in this configuration with the sense amplifier 202, the same path can be used for both reading and programming process. There will be no need for extra devices such as output select devices that are typically used for opening reading paths when the reading process is to be performed. The selection of fuse cell within a fuse array, to be discussed in detail in FIG. 4A, is also simplified since the specific electrical fuse can be selected by turning the attached programming device with a select signal. This removes the need for multiplexers that are typically used in conventional circuits to select the correct fuse cell. Without the need of these extra devices, read path sensing sensitivity can be improved. This configuration also allows the same decoder (not shown) to be used for both reading and programming operations, thereby further simplifying the circuit.

It is noteworthy that only one fuse cell 204 is shown in the fuse module 205 to help demonstrate how individual electrical fuse such as the electrical fuse 208 is sensed. It Is understood that the fuse module 205 can be a fuse array containing multiple fuse cells without the need for extra multiplexers, since a specific electrical fuse is selected by the selection of the select device. This configuration will be discussed in detail later below.

Figure 3A:
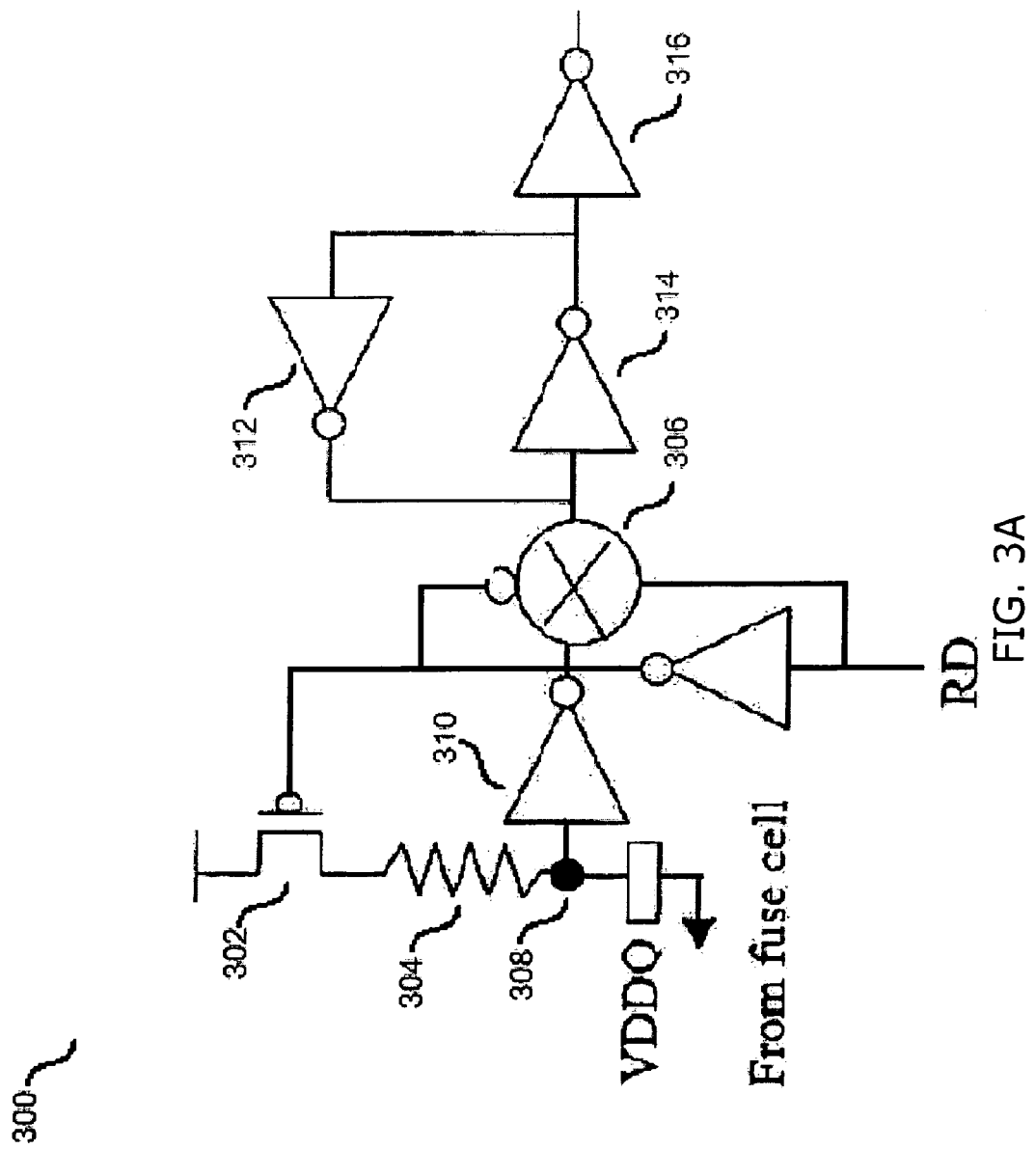
FIGS. 3A to 3C illustrate examples of sense amplifiers that may be implemented in various embodiments of the present invention.

FIG. 3A illustrates a sense amplifier 300 that may be implemented in various embodiments of the present invention. A PMOS device 302 and a reference resistor 304 work together to construct a voltage divider with the fuse array that is connected through a source voltage, e.g., VDDQ. The sense amplifier 300 is designed to compare the resistance of an electrical fuse against that of the reference resistor 304 to determine a logic state output. It is understood that the source voltage VDDQ is kept between about 2.5 and 3 volts during a program process, and internally clamped to less than 1 volt during a read process.

The read process begins by asserting a high signal into a read enable line RD. The inverted signal will turn on the PMOS device 302 and open a pass gate 306. Voltage measured at a node 308 will be the voltage divided by the reference resistor 304 and the electrical fuse selected from the connected fuse array. Impedances of the PMOS device 302 and the select device within the fuse cell containing the electrical fuse, not shown, are low and insignificant. With the pass gate 306 open due to a high signal at the read enable line RD, the signal at the node 308 will be inverted by an inverter 310 and is allowed to enter a latch made of inverters 312 and 314. The signal at the latch can be outputted as the logic state output of the sense amplifier 300 after inverted by an inverter 316.

Figure 3B:
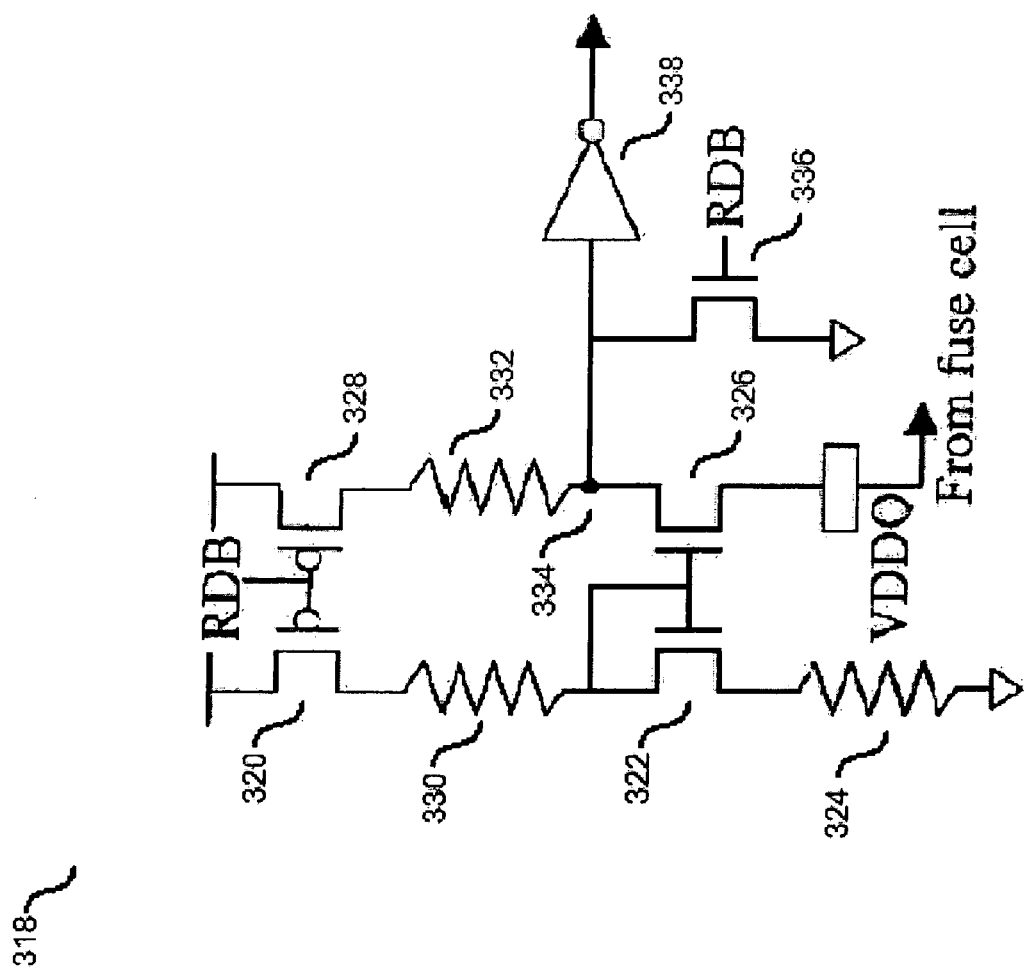

FIG. 3B illustrates a sense amplifier 318 that may be implemented in various embodiments of the present invention. The sense amplifier 318 includes a PMOS device 320, a NMOS device 322, and a reference resistor 324 working together to construct a bias circuit. The source of a NMOS device 326 is connected to a fuse cell which contains the electrical fuse that will be read.

When the sense amplifier 318 compares the resistance of the selected electrical fuse, not shown, against that of the reference resistor 324 to determine a logic state output for the reading process, a low signal is asserted through a read enable line RDB. Both PMOS devices 320 and 328 will be turned on, thereby allowing source voltage to go through load resistors 330 and 332 to turn on the NMOS devices 322 and 326. In addition, the PMOS 320, the NMOS 322, and the resistor 324 form a bias circuit. Since the gate of the NMOS device 322 is connected to the gate of the NMOS device 326, the NMOS device 326 can stay in the saturation region. This allows any resistance difference between electrical fuse and the reference resistor 324 to be amplified to an output node 334. With the low signal at the read enable line RDB, a NMOS device 336 is turned off to allow the amplified signal at the output node 334 to be outputted through an inverter 338.

When the sense amplifier 318 is disabled and the read enable line RDB has a high signal, the PMOS devices 320 and 328 will be turned off, thereby cutting off a source voltage VDDQ to the sense amplifier 318, while the NMOS device 336 will be turned on to ground, thereby grounding the output node 334.

It is noteworthy that the load resistors 330 and 332 are implemented mainly to help improve tracking, while the PMOS devices 320 and 328 are implemented for power down purposes. As such, the load resistors 330 and 332 are optional. In addition, the PMOS 320, the NMOS 322, and the resistor 324 form a bias circuit. The sense amplifier shown in FIG. 3B has a higher gain than the one shown in FIG. 3A.

Figure 3C:
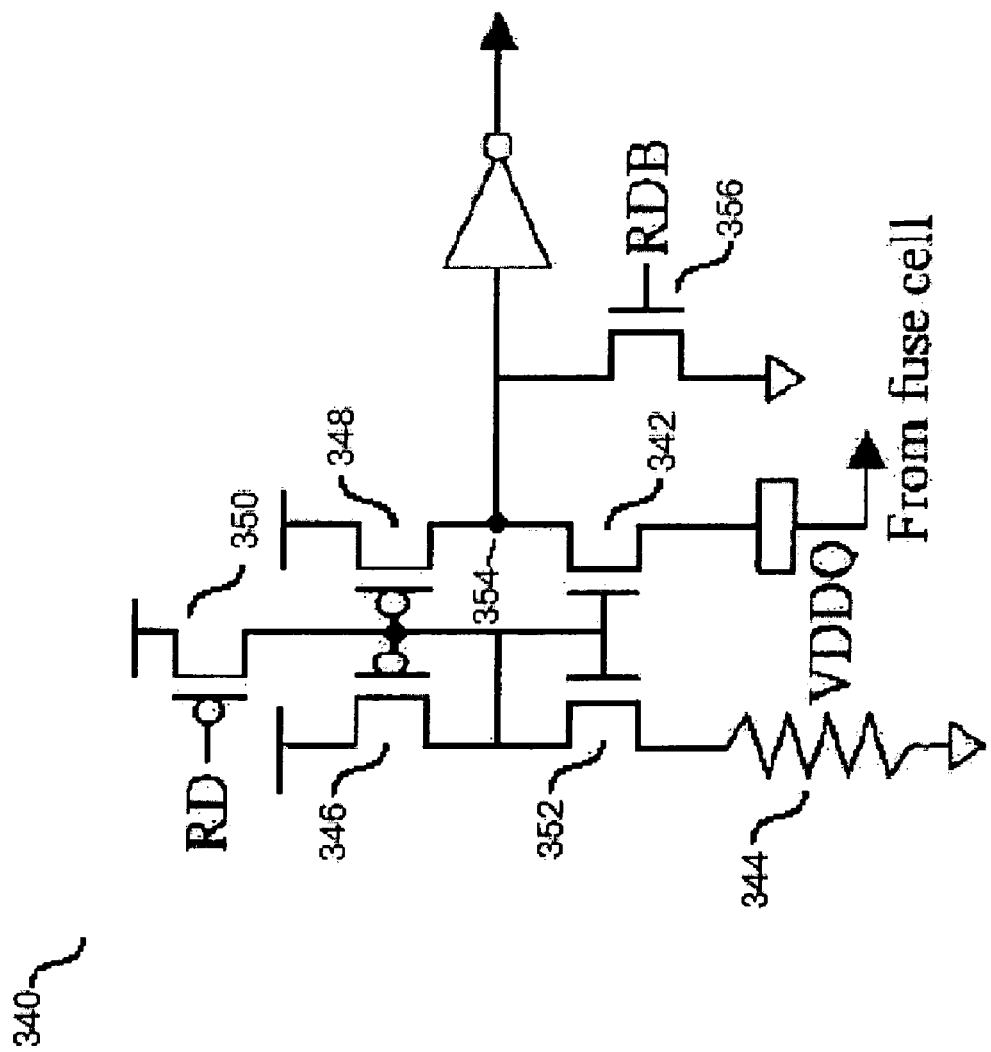

FIG. 3C illustrates a sense amplifier 340 that may be implemented in various embodiments of the present invention. The sense amplifier 340 compares the resistance of a selected electrical fuse of a fuse cell connected to the source of a NMOS device 342 against that of a reference resistor 344 to determine a logic state output. A PMOS device 346 is configured as a diode to bias a PMOS device 348 such that the PMOS device 348 can operate in saturation with higher output impedance. During reading process, a PMOS device 350 will be turned off by a high signal from a read wordline RD and provides a diode bias voltage for the gates of the PMOS devices 346 and 348, thereby allowing the PMOS device 346 to bias the PMOS device 348 so it can operate in saturation region. This allows source voltage to reach the gates of NMOS devices 342 and 352, thereby turning on both devices. The NMOS device 342 will stay in saturation region, thereby allowing any resistance difference between fuse terminal and the reference resistor 344 to be outputted at a node 354 when a NMOS device 356 is turned off during reading process.

FIG. 4A illustrates a circuit 400 for monitoring resistance of an electrical fuse in at least one fuse cell in a fuse array 402 in accordance with the second embodiment of the present invention. The fuse array 402 is connected to a sense amplifier 404 through a source voltage VDDQ. As shown in FIG. 4A, the fuse array 402 contains multiple fuse cells, each of which contains an electrical fuse and a select device. For example, a fuse cell 405 includes an electrical fuse 406 and a select device 408. The sense amplifier 404 is designed to read the selected electrical fuse by comparing resistance of the electrical fuse against that of a reference resistor 410. A decoder 412 controls the select devices during read and program process.

When the electrical fuse 406 needs to be read, the decoder 412 helps to locate the exact fuse cell that contains the electrical fuse 406 by providing a signal for the select device 408. The sense amplifier 404 then compares the resistance of the electrical fuse 406 against that of the reference resistor 410, and provides an output.

Figure 4B:
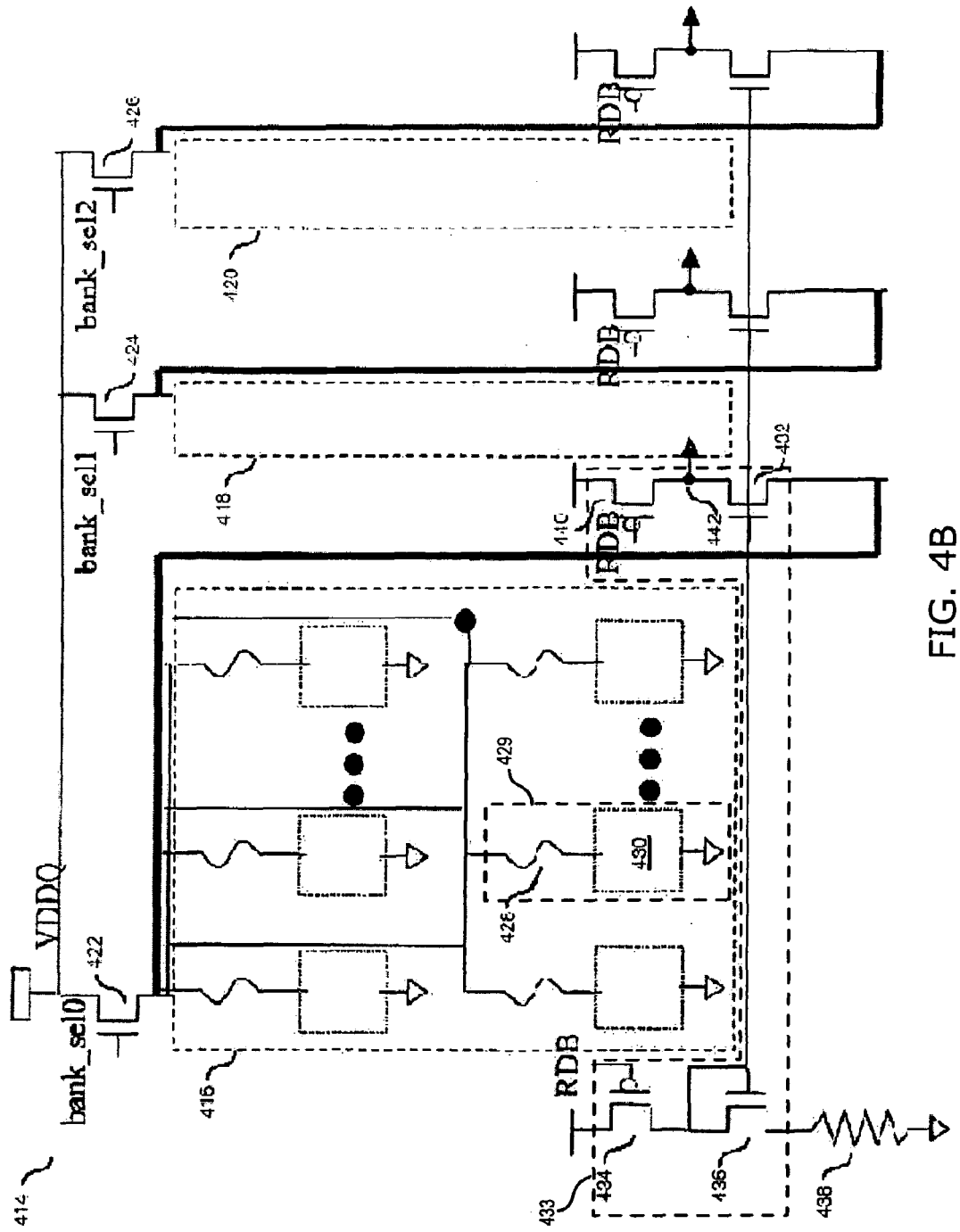
FIG. 4B illustrates a circuit for monitoring resistance of an electrical fuse in at least one fuse cell in at least one fuse array in accordance with the third embodiment of the present invention.

FIG. 4B illustrates a circuit 414 for monitoring resistance of an electrical fuse in at least one fuse cell in at least one fuse array in accordance with the third embodiment of the present invention. A large fuse array is broken down to three fuse banks 416, 418, and 420, each connectable to its own sense amplifier mirror device. With a large fuse array divided into three different banks, the leakage current issue discussed earlier may be reduced by two-third. The desired bank is selectable with the attached bank select control devices such as NMOS devices 422, 424, and 426, respectively, by bank select lines bank_sel0, bank_sel1 and bank_sel2. A select signal, not shown, is connected to various select devices to determine which electrical fuse needs to be read or programmed.

For example, if an electrical fuse 428 in a fuse cell 429 needs to be read, the fuse bank 416 must first be selected by turning on the NMOS device 422 with a high signal from the bank select line bank_sel0. A select device 430 is then selected by an incoming signal, not shown. This provides a direct connection between the electrical fuse 428 and the source of a NMOS device 432 of a sense amplifier 433, which includes PMOS devices 434 and 440, and NMOS devices 432 and 436. It is understood that FIG. 4B shows that each bank of fuse is equipped with a sense amplifier such as the one 433 so that the parasitic resistances are limited to the select devices. Furthermore, since the high voltage node VDDQ is somewhat isolated from the sense amplifiers, the read speed and program-read turnaround speed can be fast. It is further noticed that all the banks can share one sense amplifier without breaking down to multiple modules.

The PMOS device 434, the NMOS device 436 and the reference resistor 438 work together to construct a bias circuit. With the gate of the NMOS device 436 connected to the gate of the NMOS device 432, the NMOS device 432 can stay in the saturation region, thereby allowing the resistance difference between the fuse terminal and the reference resistor 438 to be amplified to an output node 442 resulting in a higher voltage gain.

The output voltage of this sense amplifier is:

$$V_{out} = I_{bias} * (R_{ref} - R_{fuse}) * (gm * R_o)$$

where $I_{bias}$ is the bias current, $R_{ref}$ is the resistance value of the reference resistor 438, $R_{fuse}$ is the resistance of the fuse being read, gm is the transconductance of the NMOS device 436, and Ro is the output impedance of the PMOS device 434 in parallel with the NMOS device 436.

As is understood by those skilled in the art, the combination of the sense amplifier 202 and the reference resistor 206 may be replaced by any of the sense amplifiers 300, 318, and 340. Similarly, the combination of the sense amplifier 404 and the reference resistor 206 may be replaced by any of the sense amplifiers 300, 318, and 340, while the combination of the sense amplifier 433 and the reference resistor 438 may be replaced by any of the sense amplifiers 300, 318, and 340.

It is further noticed that during a normal programming process, only one of the bank select signals is turned on, and off when it is during a read process. However, if an on-chip resistance monitoring process is conducted, the bank select signals can all be turned on to monitor fuse resistance. This can be referred to as a test mode for the fuse array.

Figure 5:
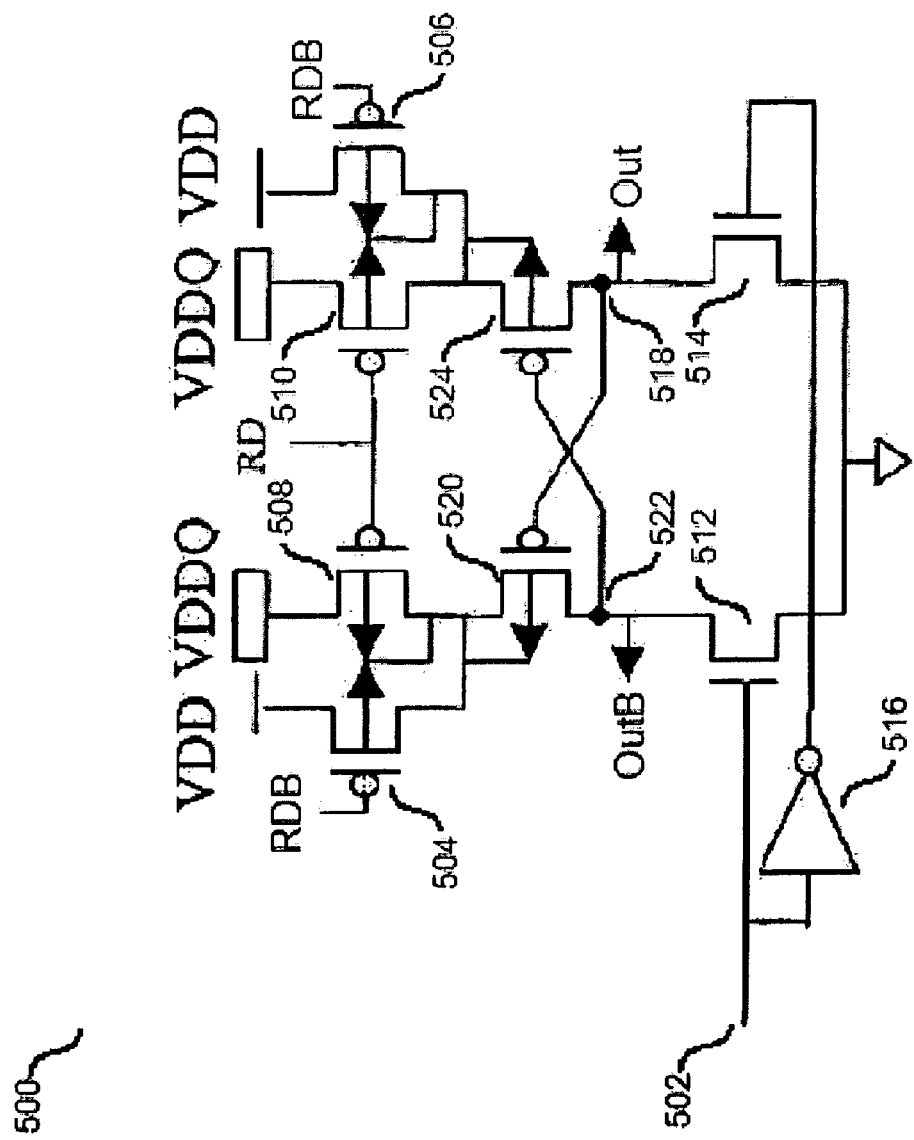
FIG. 5 illustrates an example of a level shifter that may be implemented in various embodiments of the present invention.

FIG. 5 illustrates an example of a level shifter 500 that may be implemented in various embodiments of the present invention. Since the VDDQ may be clamped to only a few hundred millivolts during a read process of the fuse arrays, the same VDDQ may not be sufficient to operate peripheral circuit of the fuse arrays such as the select devices of the fuse cell (e.g., an NMOS transistor). Therefore, a level shifter type voltage supply circuit may be needed to assure that it provides an operating voltage swing to these peripheral circuits when the VDDQ is clamped during a read process of the fuse array.

The level shifter 500 is supplied by both a high-voltage supply source VDDQ and a low voltage supply source VDD. This configuration allows incoming data signal at an input pin 502 to be level-shifted to either high or low voltage. Signal lines RD and RDB apply signals to control PMOS devices 504, 506, 508, and 510 to determine the output voltage to be in either low voltage VDD or high voltage VDDQ. When the signal line RD is low during programming process, the PMOS devices 504 and 506 are turned off and the PMOS devices 508 and 510 are turned on. As such, the output "Out" of the level shifter 500 will be a high voltage VDDQ. When the signal line RD is high during reading process, the PMOS devices 508 and 510 will be turned off and the PMOS devices 504 and 506 will be turned on. As such, the output "Out" of the level shifter 500 will be a low voltage VDD.

When a low signal enters the level shifter 500 through the input pin 502 and the signal line RD is set to low for an output with a high voltage VDDQ, the PMOS devices 504 and 506 will be turned off while the PMOS devices 508 and 510 will be turned on to allow the output "Out" to be a high voltage VDDQ. A NMOS device 512 will be turned off due to the low signal at the input pin 502 and a NMOS device 514 is turned on after an inverter 516 inverts the low signal at the input pin 502 to high. A node 518 is then pulled low to ground, thereby turning on a PMOS device 520 and allowing a high voltage VDDQ to reach an output "OutB" for output.

When a low signal enters the level shifter 500 through the input pin 502 and the signal line RD is set to low for an output with a high voltage VDDQ, the PMOS devices 504 and 506 will be turned off while the PMOS devices 508 and 510 will be turned on to allow the output "Out" to be a high voltage VDDQ. A NMOS device 512 will be turned off due to the low signal at the input pin 502 and a NMOS device 514 is turned on after an inverter 516 inverts the low signal at the input pin 502 to high. A node 518 is then pulled to ground, thereby turning on a PMOS device 520 and allowing a high voltage VDDQ to reach an output "OutB" for output.

When a high signal enters the level shifter 500 through the input pin 502 and the signal line RD is set to high for an output with a low voltage VDD, the PMOS devices 508 and 510 will be turned off while the PMOS devices 504 and 506 will be turned on to allow the output "Out" to be a low voltage VDD. The NMOS device 512 will be turned on due to the high signal at the input pin 502 and the NMOS device 514 is turned off after the inverter 516 inverts the high signal to low. A node 522 will be pulled to ground, thereby turning on a PMOS device 524 and allowing a low voltage VDD to reach the output "Out" for output.

This invention provides a method to monitor fuse resistance before and after programming without additional pads or circuits. Sense amplifiers are implemented at supply voltage lines to compare the resistance of a selected electrical fuse against that of a reference resistor. By selecting the correct select device, the specific electrical fuse within a large fuse array may be located, thereby allowing one sense amplifier to monitor a large number of electrical fuses. Several different sense amplifiers are also introduced in this invention to provide different forms of output.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A resistance monitoring system for electrical fuses, the system comprising:
   at least one non-regenerative sense amplifier;
   at least one fuse module having at least one fuse cell coupled to a first terminal of the sense amplifier; and
   a reference resistor coupled to a second terminal of the sense amplifier,
   wherein a source voltage node between the fuse module and the sense amplifier is monitored to reflect a resistance of the fuse cell by controlling a voltage at the source voltage node in a range between about 2.5 and 3.0 volts during a programming process, and clamping the same to less than 1 volt during a reading process.

2. The system of claim 1, wherein the fuse cell comprises a select device coupled with an electrical fuse.

3. The system of claim 1, wherein the fuse module further includes a plurality of fuse cells and a decoder for selecting a predetermined fuse cell.

4. The system of claim 1, wherein the fuse module further includes a plurality of banks of fuse cells.

5. The system of claim 4, wherein the sense amplifier is shared by the banks of fuse cells.

6. The system of claim 4, wherein each bank is coupled to a separate sense amplifier.

7. The system of claim 1, wherein the sense amplifier further includes a predetermined transistor coupled in series with the reference resistor to form a voltage divider circuit with the reference resistor connected to the source voltage node of the fuse module.

8. The system of claim 1, wherein the sense amplifier further includes a bias circuit having the reference resistor coupled in series with at least one MOS transistor, wherein an output in generated based on a difference in resistance between the fuse module and the reference resistor.

9. The system of claim 1, further comprising a voltage supply circuit coupled to one or more peripheral circuits of the fuse module for providing a higher voltage range during a program process and a low but operating voltage range during a read process.

10. A resistance monitoring system for electrical fuses, the system comprising:
    a fuse module having a plurality banks of fuse cells;
    at least one non-regenerative sense amplifier coupled with the fuse module;
    a reference resistor coupled to the sense amplifier; and
    a bank select control for selecting each bank of fuse cells to be coupled through a source voltage node to the sense amplifier, wherein the source voltage node is monitored to reflect a resistance of the fuse cell by controlling a voltage at the source voltage node in a range between about 2.5 and 3.0 volts during a programming process, and clamping the same to less than 1 volt during a reading process.

11. The system of claim 10, wherein the fuse module further includes a decoder for selecting a predetermined fuse cell.

12. The system of claim 10, wherein each bank is coupled to a separate sense amplifier.

13. The system of claim 10, wherein the sense amplifier further includes a voltage divider circuit, including the reference resistor, coupled with the fuse module through the source voltage node.

14. The system of claim 10, wherein the sense amplifier further includes a bias circuit having the reference resistor coupled in series with at least one MOS transistor, wherein an output is generated based on a difference in resistance between the fuse module and the reference resistor.

15. The system of claim 10, further comprising a voltage supply circuit coupled to one or more peripheral circuits of the fuse module for providing an operating voltage during a read process.

16. A resistance monitoring system for electrical fuses, the system comprising:
- a fuse module having a plurality banks of fuse cells;
- at least one non-regenerative sense amplifier coupled with each bank of fuse cells;
- a reference resistor coupled to the sense amplifier;
- a bank select control for selecting each bank of fuse cells to be coupled through a source voltage node to the sense amplifier, wherein the source voltage node is monitored to reflect a resistance of the fuse cell; and
- a voltage supply circuit coupled to one or more select devices of the fuse cell for providing the source voltage node with a first voltage range for operating the fuse module during a program process and a second voltage range lower than the first voltage range during a read process, wherein the second voltage range is below 1 volt during the read process and the first voltage range between about 2.5 and 3.0 volts during the program process.

17. The system of claim 16, wherein the sense amplifier further includes a voltage divider circuit with the source voltage node being a mid point between the reference resistor and the fuse module.

18. The system of claim 16, wherein the sense amplifier further includes a bias circuit having the reference resistor coupled in series with at least one MOS transistor, wherein an output is generated based on a difference in resistance between the fuse module and the reference resistor.

* * * * *